United States Patent
Huisman et al.

(10) Patent No.: US 7,139,950 B2
(45) Date of Patent: Nov. 21, 2006

(54) SEGMENTED SCAN CHAINS WITH DYNAMIC RECONFIGURATIONS

(75) Inventors: Leendert M. Huisman, South Burlington, VT (US); Leah M. P. Pastel, Essex, VT (US)

(73) Assignee: International Business Machines Corporation, Armonk, NY (US)

( * ) Notice: Subject to any disclaimer, the term of this patent is extended or adjusted under 35 U.S.C. 154(b) by 378 days.

(21) Appl. No.: 10/707,957

(22) Filed: Jan. 28, 2004

(65) Prior Publication Data

US 2005/0166108 A1 Jul. 28, 2005

(51) Int. Cl.
*G01R 31/28* (2006.01)
*G06F 17/50* (2006.01)
(52) U.S. Cl. .......................................... 714/726; 716/4
(58) Field of Classification Search ........ 714/724–727, 714/729; 716/4
See application file for complete search history.

(56) References Cited

U.S. PATENT DOCUMENTS

| | | | |
|---|---|---|---|
| 6,408,414 B1 * | 6/2002 | Hatada .................... | 714/727 |
| 6,519,729 B1 * | 2/2003 | Whetsel .................. | 714/727 |
| 6,615,380 B1 * | 9/2003 | Kapur et al. ............ | 714/738 |
| 6,711,708 B1 * | 3/2004 | Shimomura .............. | 714/727 |
| 6,766,501 B1 * | 7/2004 | Duggirala et al. ....... | 716/11 |
| 2003/0005363 A1 | 1/2003 | Bassett | |

OTHER PUBLICATIONS

Scan Chain Diagnosis; "High-Accuracy Flush-and-Scan Software Diagnostic", by Kevin Stanley; pp. 56-62.

* cited by examiner

*Primary Examiner*—Cynthia Britt
(74) *Attorney, Agent, or Firm*—Scully, Scott, Murphy & Presser, P.C.; Michael J. LeStrange, Esq.

(57) ABSTRACT

A method is disclosed of diagnosing defects in scan chains by statically and dynamically segmenting and reconfiguring the scan chains. A plurality of serially extending scan chains are partitioned into a plurality of serially arranged equal length segments such that each serially extending scan chain comprises a plurality of serially extending segments. A plurality of multiplexors are positioned between the plurality of segments of each scan chain, and are controlled and utilized to connect each segment of the scan chain to the next serial segment in the same scan chain, or to connect each segment of the scan chain to the next serial segment in a lateral adjacent scan chain. Scan in data patterns are introduced into the plurality of serially extending scan chains. Particular defective segments of the plurality of serially extending scan chains are identified by controlling the multiplexors to connect and shift the data pattern out of each segment of a scan chain serially to the next serial segment in the same scan chain, or to connect and shift the data pattern out of each segment of the scan chain to the next serial segment in an adjacent lateral scan chain, with a sequence of serial shifts and serial-lateral shifts being selected to identify particular defective segments of the plurality of serially extending scan chains.

17 Claims, 8 Drawing Sheets

SCAN CHAIN SEGMENTATION

BASIC SEGMENTATION

FAILING CHAIN 1

FAILING CHAIN 1

FAILING CHAINS 1 AND 3

FAILING CHAINS 1 AND 3, 1A FAULTY

FAILING CHAINS 1 AND 3, 1D FAULTY

UNEQUAL CHAIN LENGTHS

SEGMENTED SCAN CHAINS WITH DYNAMIC RECONFIGURATIONS

BACKGROUND OF INVENTION

Field of the Invention

The present invention relates generally to segmented scan chains with dynamic reconfigurations, and more particularly pertains to a method of diagnosing defects in scan chains by segmenting and reconfiguring the scan chains.

Each serially extending scan chain is partitioned into segments. A single pin controls multiplexors positioned between the scan chain segments that make a data pattern in a segment feed into the next segment in the same scan chain, or feed into the next segment of its neighboring scan chain. The control pin can be used to statically restructure the scan chains, or it can be used to dynamically restructure the scan chains, when reading the contents of the scan chains, to route blocks of data as long as the length of a segment through the scan chains. When used dynamically, the segments need to be of equal length.

A great deal of diagnostically useful information is contained in the passes and fails of individual scan chains. This information becomes more detailed the more the scan chains differ in content, since then differences in fail rates can be correlated to differences in content. Unfortunately, the lengths of scan chains have been increasing ever since scan chains were first designed, since the scan chain number has remained roughly constant, while the number of latches to be placed in scan chains continues to increase. The ability to locate a defect in small portions of a scan chain rather than anywhere within the scan chain would dramatically increase the diagnostic information that can be obtained from scan chain fails.

Discussion of the Prior Art—Bassett U.S. publication No. 2003/0005363 discloses a technique for statically reconfiguring scan chains, such that passes or fails of a given small segment in a given scan chain can be determined by applying a scan test in a sufficient number of static configurations. The technique requires an even number of scan chains, as well as multiple test pins and control lines to affect the scan chain reconfigurations.

The present invention distinguishes from Bassett by using a lateral rotate structure rather than pairing, by using a single control pin, and by doing the lateral shifts dynamically in time rather than just statically. Moreover, the static restructuring of scan chains in Bassett requires multiple control pins.

The only other know technique is full diagnosis of chain fails, as described by Stanley (*Stanley, K*.; Design & Test of Computers, IEEE, Volume: 18 Issue: 6, November-December 2001, Page(s): 56–62).

SUMMARY OF INVENTION

The present invention provides a method of diagnosing defects in scan chains by segmenting and reconfiguring the scan chains. A plurality of serially extending scan chains are partitioned into a plurality of serially arranged segments such that each serially extending scan chain comprises a plurality of serially extending segments. A plurality of multiplexors are positioned between the plurality of segments of each scan chain, and are controlled and utilized to connect each segment of the scan chain to the next serial segment in the same scan chain, or to connect each segment of the scan chain to the next serial segment in a lateral adjacent scan chain. Scan in data patterns are introduced into the plurality of serially extending scan chains. Particular defective segments of the plurality of serially extending scan chains are identified by controlling the multiplexors to connect and shift the data pattern out of each segment of a scan chain serially to the next serial segment in the same scan chain, or to connect and shift the data pattern out of each segment of the scan chain to the next serial segment in an adjacent lateral scan chain, with a sequence of serial shifts and serial-lateral shifts being selected to identify particular defective segments of the plurality of serially extending scan chains.

BRIEF DESCRIPTION OF DRAWINGS

The present invention for segmented scan chains with dynamic reconfigurations may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION

In the analysis of the present invention, a scan in data pattern consisting of a given sequence of logical ones and zeros is scanned into each scan chain, and then a scan out data pattern scanned out of the end of the scan chain is examined and compared to an expected scan out data pattern, normally identical to the input scan in data pattern or to a logical inverse of the input scan in data pattern, to determine if the scan chain is functioning properly or not, as is generally known in this art.

A preferred embodiment of the present invention partitions a scan chain into equal length segments, with the number segments in each scan chain being equal to the number of scan chains. The scan chains are ordered in a fashion such that each scan chain has exactly one unique neighbor. A single pin controls switches, multiplexors in a preferred embodiment, that make a given segment in a given scan chain feed into the next segment in the same scan chain, or into the next segment of its neighboring scan chain. The control pin can be used statically to restructure the scan chains, or it can be used dynamically, when reading the contents of the scan chains, to route blocks of data as long as the length of a segment through the scan chains.

If not too many scan chains fail, it is possible to determine whether or not each segment passes or fails. With a single scan chain, only one extra scan chain test is required to determine completely which segments in the failing scan chain pass and which segments fail. This technique is independent of the number of scan chains, as long as there are at least two scan chains, and requires only a single control pin.

Figure 1:
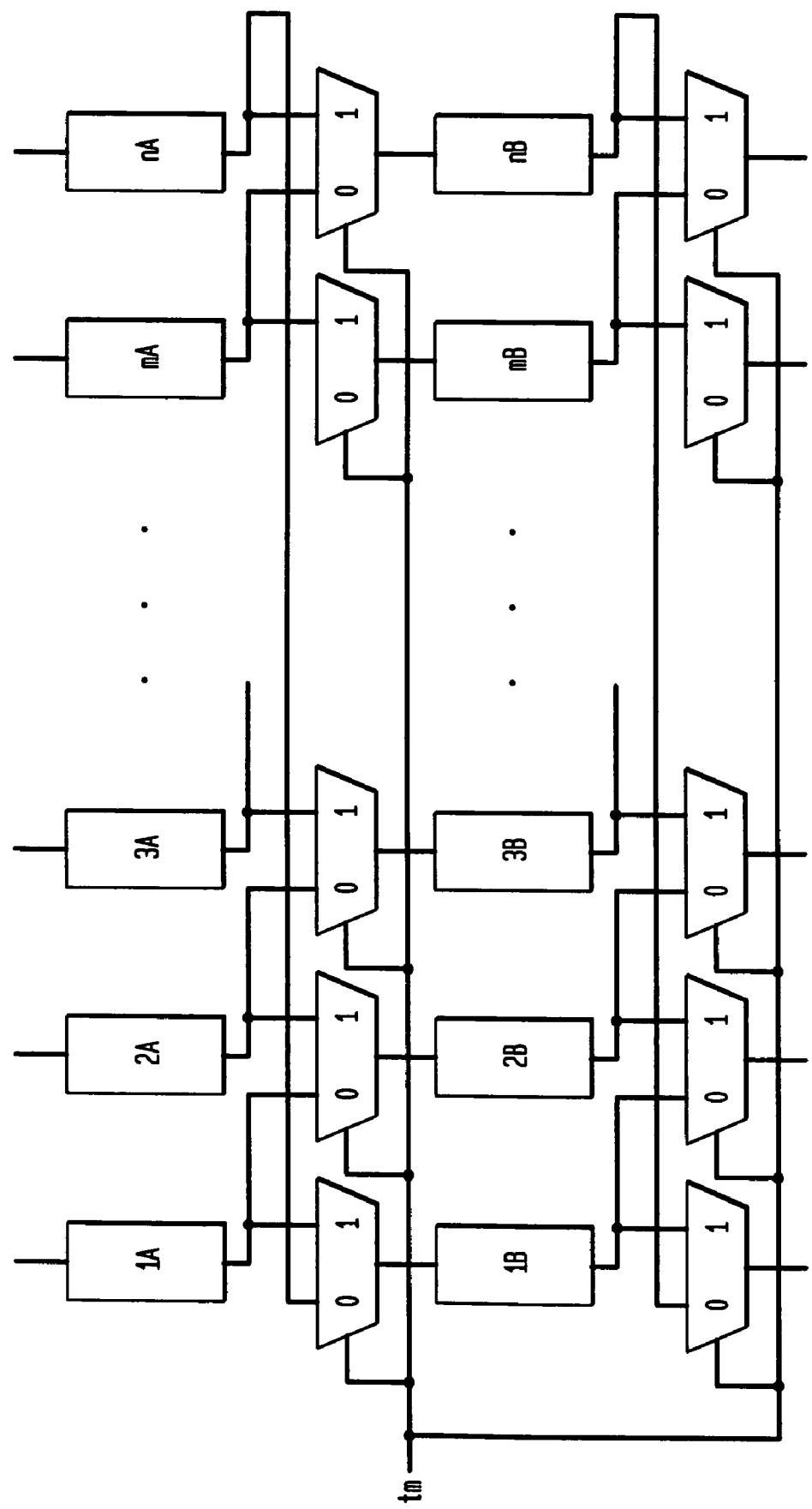
FIG. 1 shows the basic structure of scan chain segmentation. The scan chain comprises vertically extending scan chains 1, 2 . . . n, wherein each vertically extending scan chain comprises segments A, B, etc.

FIG. 1 shows the basic structure of scan chain segmentation. The scan chain comprises vertically serially extending scan chains 1, 2 . . . n, wherein each vertically serially extending scan chain comprises a plurality of segments A, B, etc. A plurality of multiplexors (muxes), having control inputs to control switching of the multiplexors, are positioned between the plurality of segments of each scan chain. The multiplexors, when having a first control input, connect each segment of each scan chain, except an initial segment, to a preceding serial segment in the same scan chain, and each segment of each scan chain, except a final segment, to a next serial segment in the same scan chain. Alternatively, the multiplexors, when having a second control input, connect each segment of each scan chain, except an initial segment, to a preceding serial-adjacent segment in an adjacent scan chain, and each segment of each scan chain, except a final segment, to a next serial-adjacent segment in an adjacent scan chain.

The muxes, depending upon their inputs tm, connect each segment (e.g. segment 1A) to the next lower segment in that same vertical scan chain (e.g. segment 1B through the mux below segment 1A) for an input tm=1, or connect each segment to the next lower segment in the adjacent right scan chain (e.g. segment 2B through the mux below segment 2A) for an input tm=0, and similarly for all of the muxes in all of the scan chains. Notice that the scan chains wrap around from right to left, such that the output of a segment in the far right scan chain n (e.g. segment nA) can be input to the next lower segment in the far right scan chain (e.g. segment nB through the mux below segment nA) for an input tm=1, or can connect that segment to the next lower segment in the far left scan chain (e.g. segment 1B through the mux below segment 1A) for an input tm=0. Thus, depending upon the inputs tm to the muxes, the output of each scan segment is directed either to the scan element directly below it in the same scan chain or to the scan element below and to its right in the adjacent right scan chain, or with a wrap around for the scan segments in the far right column to the scan element below and to its far left in the far left scan chain.

FIG. 1 presents a planar view of the circuit such that data connections from scan segments in the far right column appear to wrap around to the scan segments below and to the far left in the far left scan chain. However, conceptually, the circuit can also be considered to present a continuous wrap around of data from the scan segments in one scan chain to the scan segments in an adjacent scan chain, such that conceptually the scan chains are arranged in a circular pattern to present a continuous wrap around of data from the scan segments in one scan chain to the scan segments in an adjacent scan chain.

Thus, in the arrangement of FIG. 1, lateral shifts of scan data are only in one direction (to the right) with a wrap around at the right edge to the left edge, only one Dc input tm is provided for mux control, and with n scan chains there are $n \times (n-1)$ muxes.

Defective segments of the scan chains are identified by controlling the muxes to shift down or to shift laterally to the right and down, with a suitable sequence of down shifts and lateral-down shifts being selected to identify defective segments. With n scan chains, there are $2^{(n-1)}$ possible mux patterns.

Figure 2:
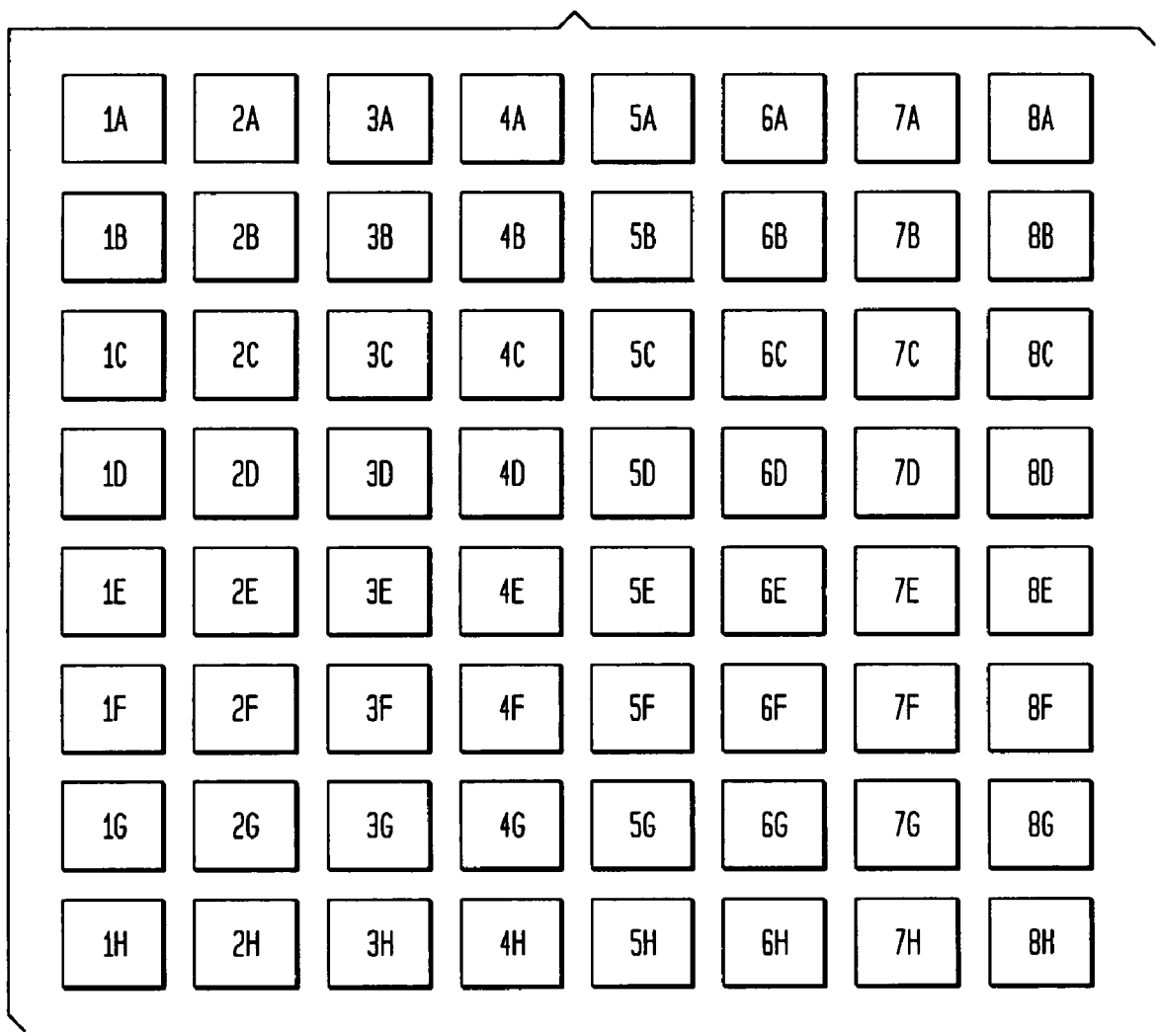
FIG. 2 illustrates a simplified arrangement of scan chains 1–8, with each scan chain having segments A–H, with the wiring and muxes (multiplexors) of FIG. 1 being omitted for simplification.

FIG. 2 illustrates a simplified arrangement of scan chains 1–8, with each scan chain having segments A–H, with the wiring and muxes of FIG. 1 being omitted for simplification.

In an elementary test, an input scan in data pattern is introduced into the top beginning of each scan chain, and the muxes are controlled such that the data patterns are clocked vertically down through the scan chains. If all scan chains were perfect with no fails, the scan out data pattern at of the bottom of each scan chain would be identical to the input scan in data pattern or the logical inverse of the input scan in data pattern.

Figure 3:
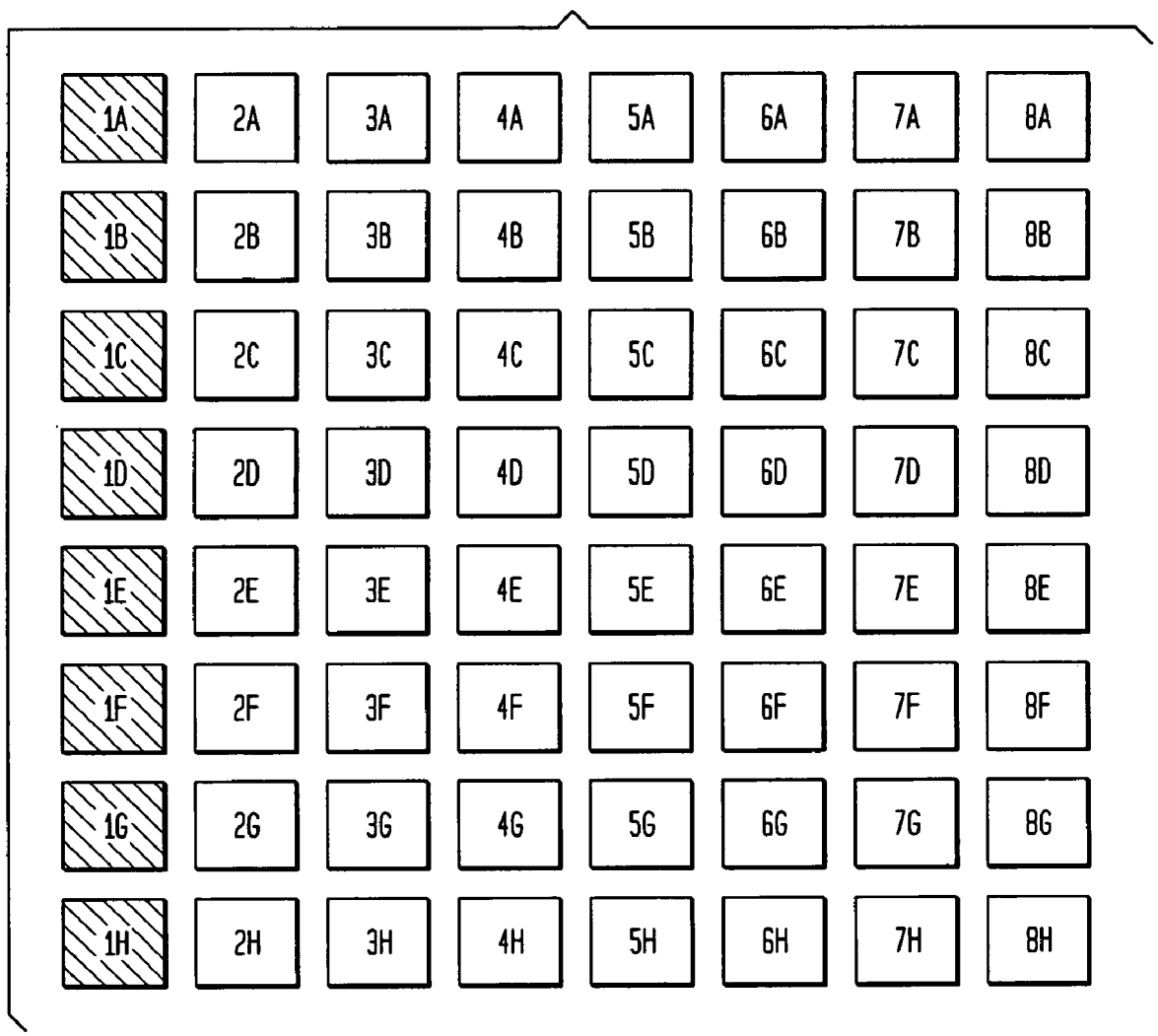
FIG. 3 illustrates an example wherein scan chain 1 suffered a fail and the scan out data pattern at the bottom of scan chain 1 is not identical to the input scan in data pattern into scan chain 1, but wherein all of the remaining scan chains 2–8 passed and the scan out data pattern at the bottom of each of scan chains 2–8 is identical to the input scan in data pattern.

FIG. 3 illustrates an example wherein scan chain 1 suffered a fail, and wherein the scan out data pattern at the bottom of scan chain 1 is not identical to the input scan in data pattern into scan chain 1, but wherein all of the remaining scan chains 2–8 passed the elementary test, and the scan out data pattern at the bottom of each of scan chains 2–8 is identical to the input scan in data pattern.

Figure 4:
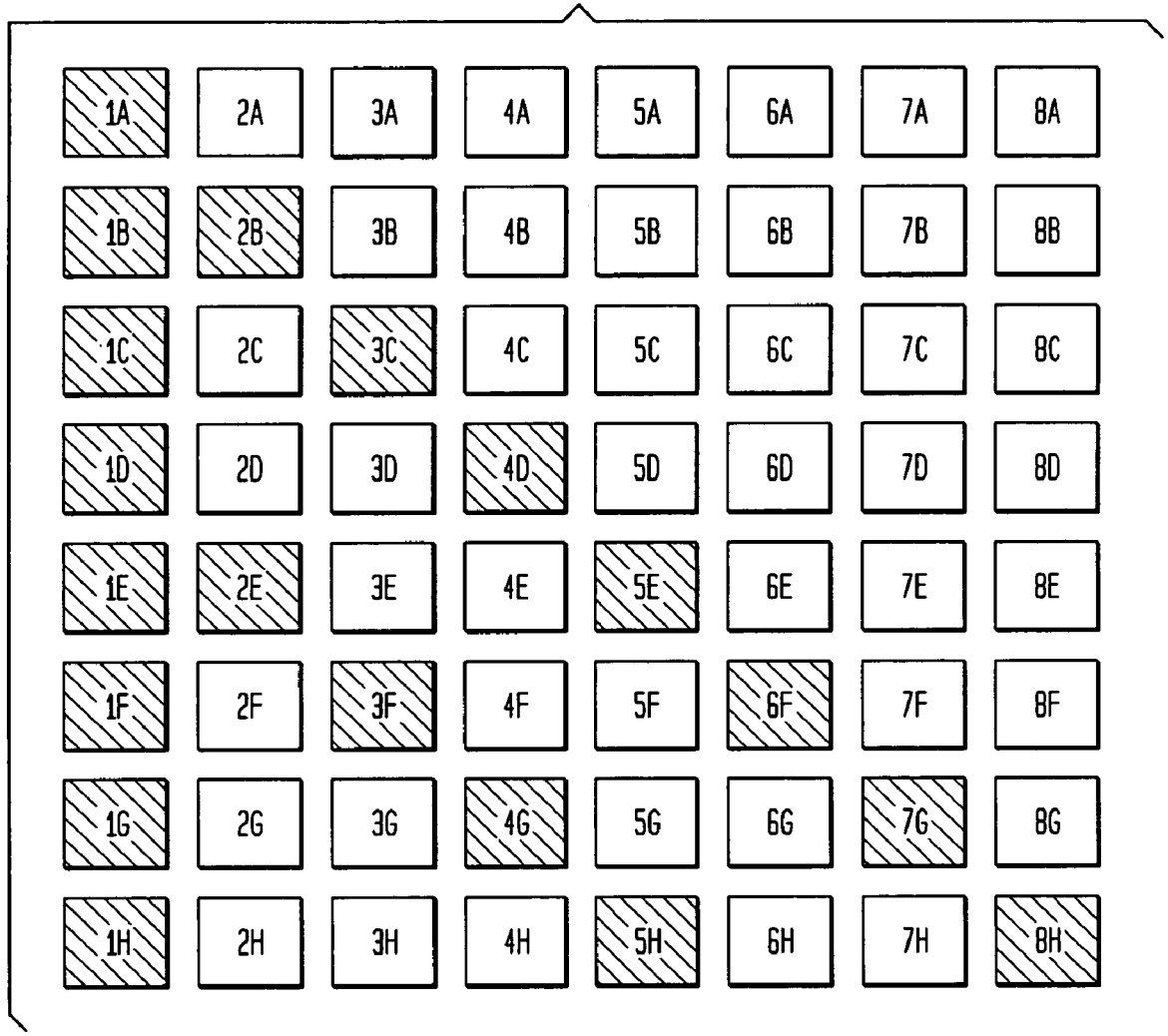
FIG. 4 shows the segment structure with the control signal for the muxes set to a value whereby the scan chains are now reconfigured along diagonal lines, and assuming that segments A and D in scan chain 1 are defective, the reconfiguration is such that the fails appear at the scanouts of scan chains 5 and 8.

FIG. 4 shows the segment structure with the control signal set to the opposite value such that the scan chains are now reconfigured along diagonal lines. Assuming that segments A and D in scan chain 1 are defective, the reconfiguration is such that the fails appear at the scanouts of scan chains 5 and 8. FIG. 4 illustrates an example of how, after the above elementary test of FIG. 3 in which scan chain 1 suffered a fail, the specific failing segments of scan chain 1 can be identified and located by changing the mux inputs tm to a 0, such that input scan in data patterns are shifted diagonally down and to the right with a wrap around at the far right scan chain to the far left scan chain. In this example, the corrupted scan out data appears at the bottom of the 5 and 8 scan chains. Since the elementary test of FIG. 3 indicated one or more failing segments in scan chain 1, by tracing the flow of data back, segments 1A and 1D are the failing segments identified by the combined tests of FIGS. 3 and 4. Note that with the wrap around, the scan data through segment 1D first passed through segments 6A, 7B and 8C before the wrap around to segment 1D.

Figure 5:
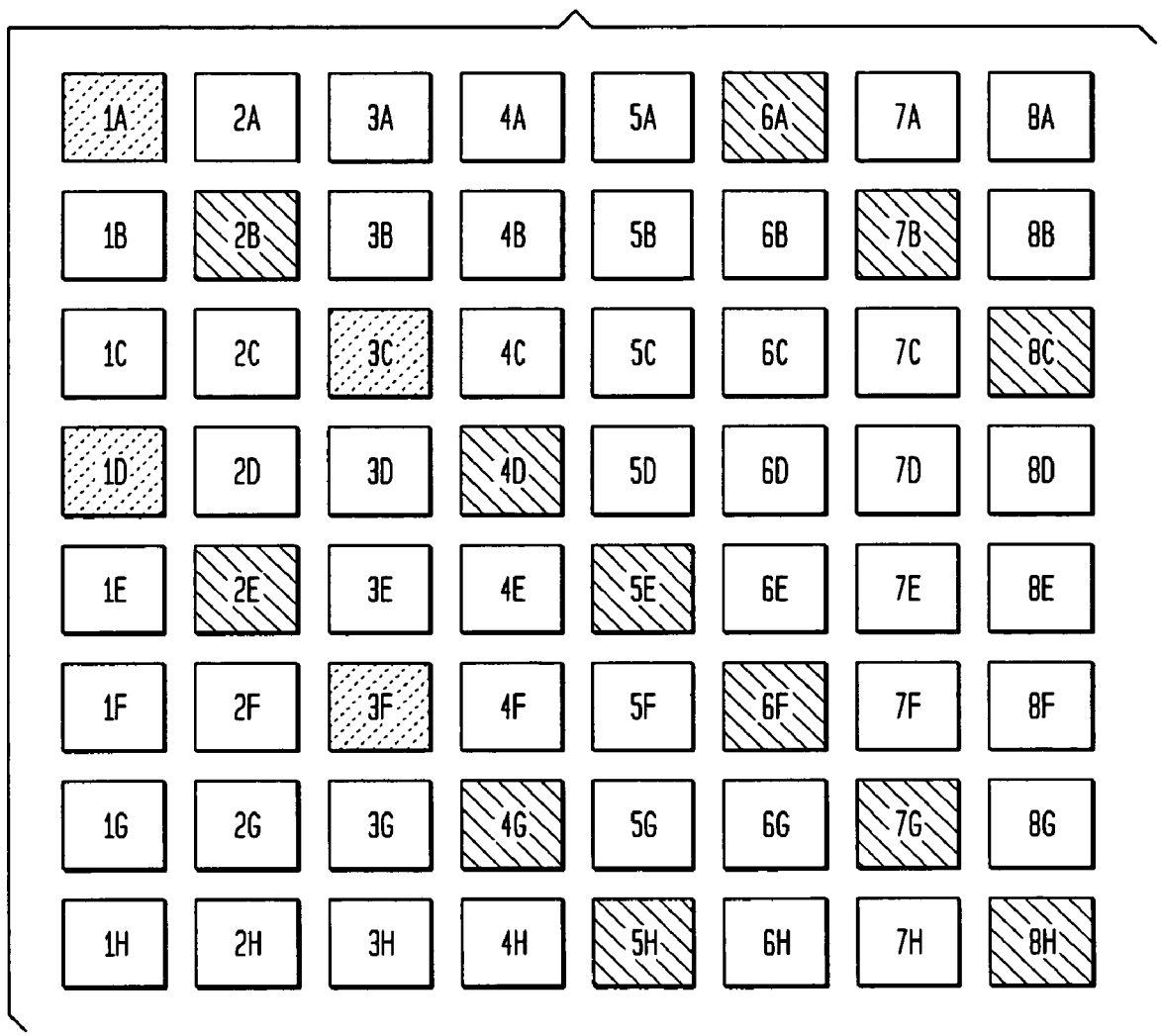
FIG. 5 illustrates an example of how, after the above elementary test of FIG. 3 in which scan chains 1 and 3 suffered fails, the particular failing segments of scan chains 1 and 3 can be further identified and located by statically changing the mux inputs tm to a 0, such that input scan in data patterns are shifted diagonally down and to the right, and after static reconfiguration the corrupted scan out data appears at the bottom of the 5 and 8 scan chains.

FIG. 5 illustrates an example of how, after the above elementary test of FIG. 3 in which scan chains 1 and 3 suffered fails, the particular failing segments of scan chains 1 and 3 can be further identified and located by statically changing the mux inputs tm to a 0, such that input scan in data patterns are shifted diagonally down and to the right with a wrap around at the far right scan chain to the far left scan chain. In this example, after static reconfiguration the corrupted scan out data appears at the bottom of the 5 and 8 scan chains. Since the elementary test of FIG. 3 indicated one or more fail segments in each of scan chains 1 and 3, by tracing the flow of data back, this implicates the segments 1A, 1D, 3C and 3F, or some combination thereof, as the failing segments identified by the combined tests of FIGS. 3 and 5.

Figure 6:
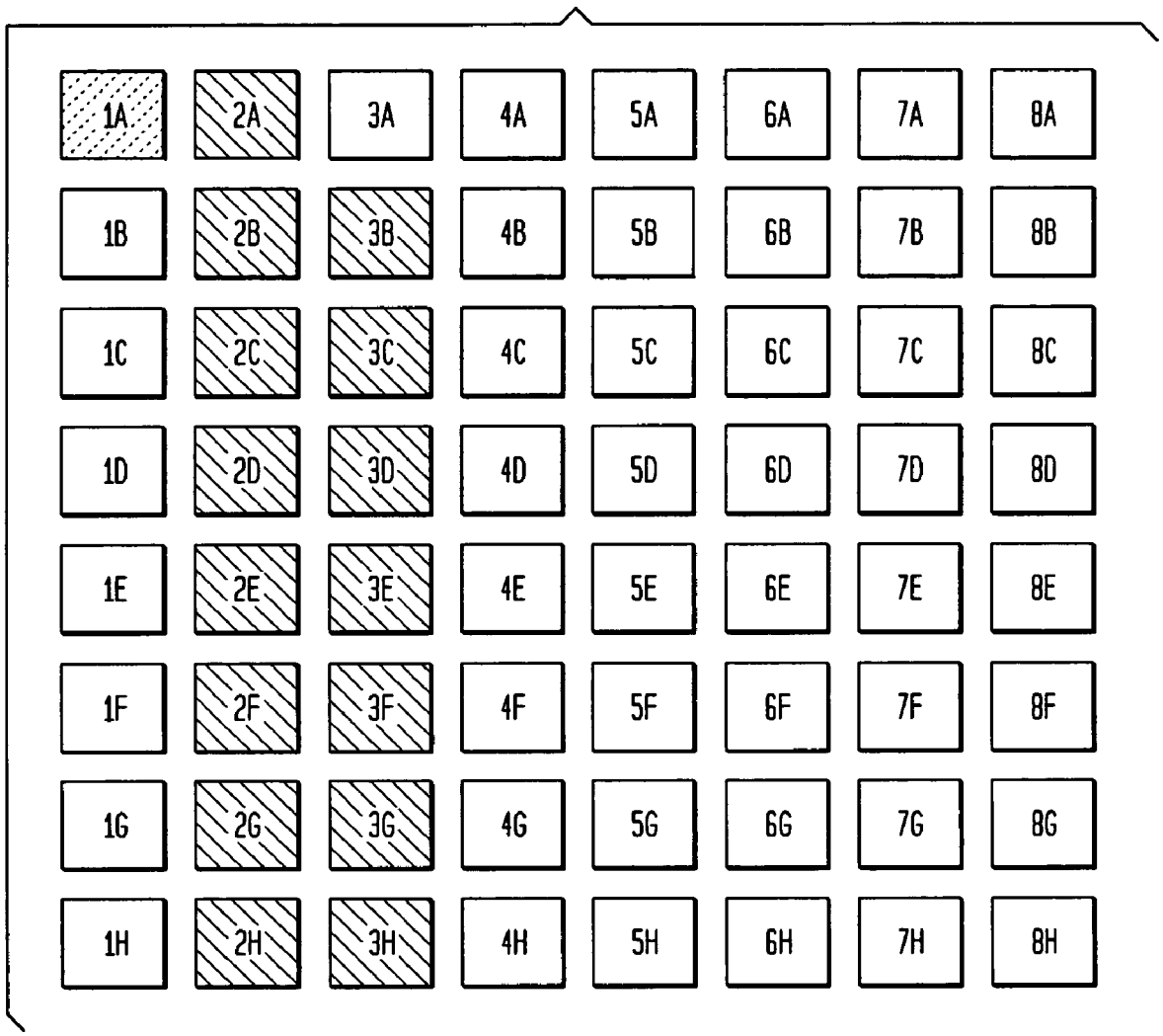
FIGS. 6 and 7 show a further refinement of the testing sequence involving dynamic shifting (during the scan unload) of the mux inputs to further determine, after the tests of FIGS. 3 and 5, which segments are defective, knowing already from the preceding tests that one of segments 1A, 1D, 3C and 3F, or some combination thereof, is defective.
Figure 7:
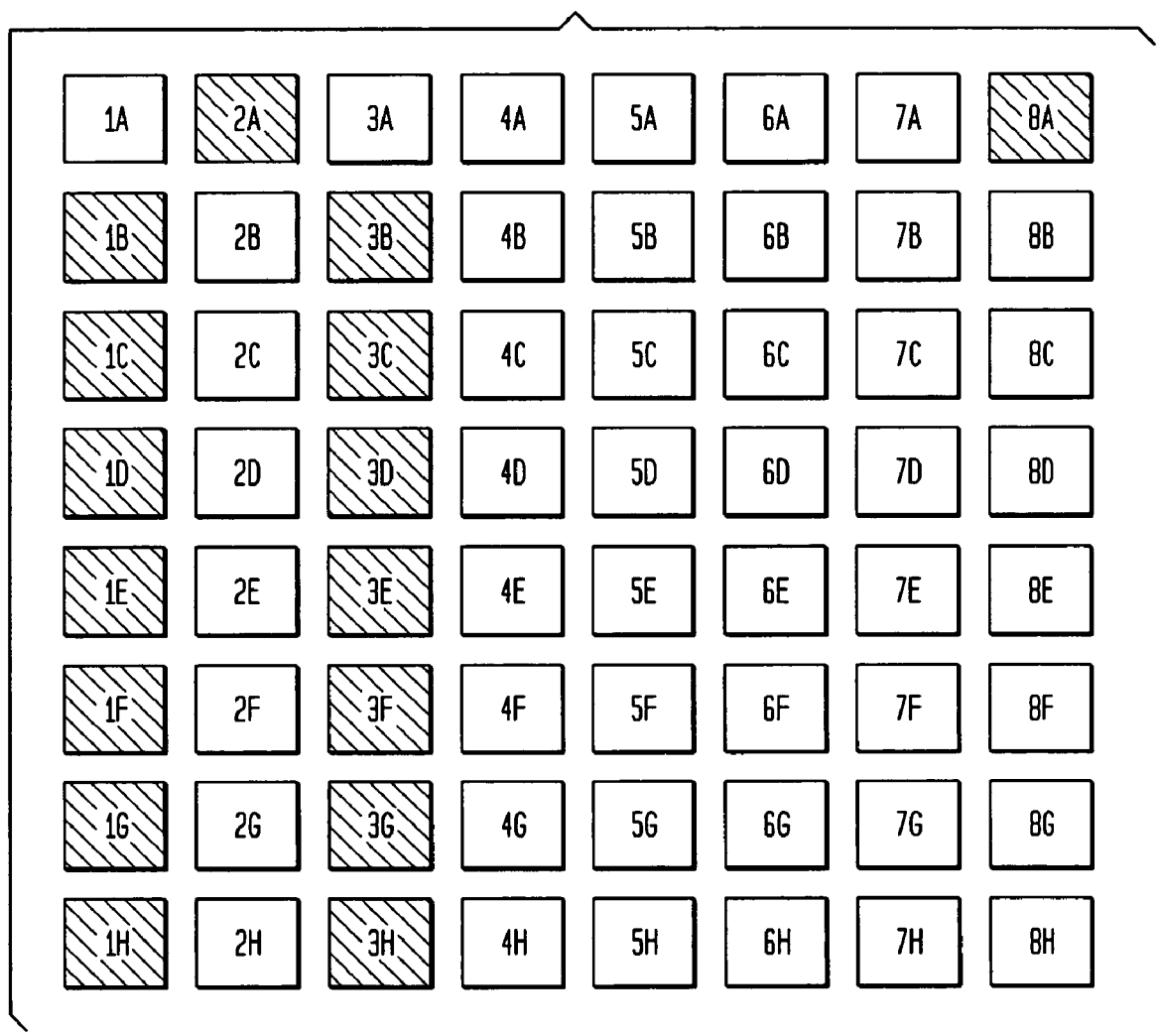

FIGS. 6 and 7 show a further refinement of the testing sequence involving dynamic shifting (during the scan unload) of the mux inputs to further determine after the tests of FIGS. 3 and 5, which segments are defective, knowing already from the preceding tests that one of 1A, 1D, 3C and 3F, or some combination thereof, is defective.

Only the test designed to determine whether 1A is defective or not will be described. First set the mux inputs tm to 0, such that all of the scan in data patterns are shifted down and diagonally to the right for one segment change or cycle, and then dynamically shift the mux inputs tm to 1, such that the data patterns are thereafter shifted vertically downward. As a result, only segment 1A among the potentially failing segments is observed at the scan out point of chain 2. FIG. 6 shows the fail data patterns from the 2 and 3 scan chains, assuming that segment 1A is defective, while FIG. 7 shows the result when segment 1A is not defective.

In summary, FIG. 5 shows an example of two failing chains (chains 1 and 3), while, after static reconfiguration, the scanouts of chains 5 and 8 fail. This implicates the segments 1A, 3F, 1D and 3C, or some combination thereof. It is not possible at this point to determine exactly which segments are defective. FIGS. 6 and 7 show the results when the control signal is dynamically shifted, that is during scan unload. The control signal is set to 0 (sideways shifts) for the length of two segments, but is then set back to normal mode during the remainder of the unload. If segment 1A were faulty, this causes scanouts 2 and 3 to fail (FIG. 6), whereas if segment 1A were not faulty, this causes scanouts 1 and 3 to fail (FIG. 7). This set of three unloads would therefore identify uniquely the status of segment 1A. Similar additional tests can determine whether segment 1D, segment 3C and segment 3F are failing or not.

Figure 8:
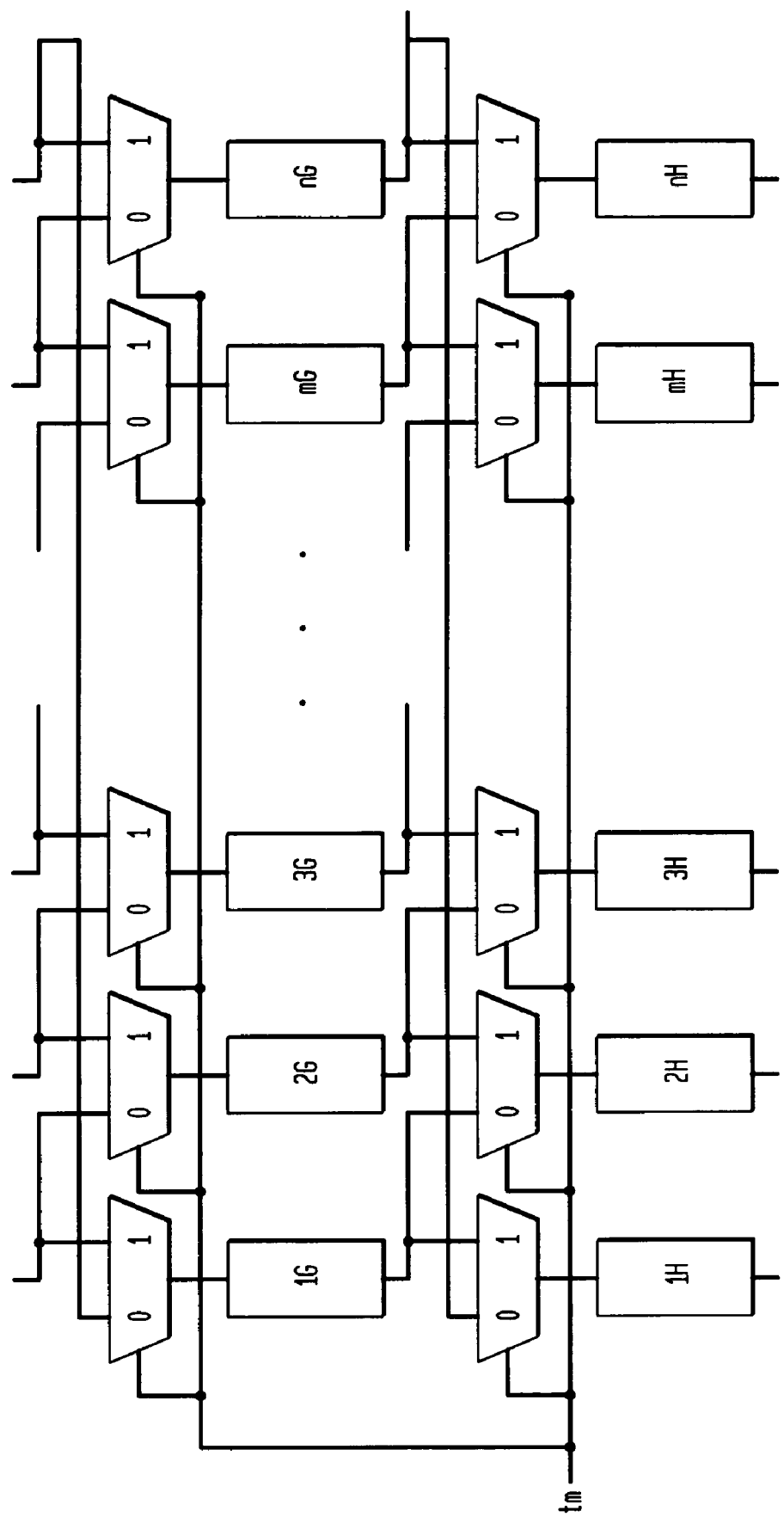
FIG. 8 illustrates how some complications due to unequal length scan chains can be handled easily, as long the discrepancies in length are not too large.

When the flow of the data is controlled dynamically, all segments have to be equally long, which may require virtual extensions of the scan chains at either the top or the bottom of the chains. An example of such a virtual extension is shown in FIG. 8, when the extension is done at the bottom of the chains. FIG. 8 shows a number of scan chains that are unequal in length. In particular, chain 2 is longer than either chain 1 or chain 3. All chains have the same number of segments, and all segments are equally long, except, perhaps the final segment. The segment location labels G and H now correspond to the final two segments in each chain, and are not intended to indicate that the chains have only two segments. When data is shifted from the G segments into the H segments, some H segments may be too short to contain all the data shifted into them from the preceding G segments. Such excess data will instead be shifted out of the scan chain and into the tester. Since the program that generated the tests knows about the lengths of the chains, and can save this excess data into a tester memory (not shown). When the data that is stored in the H segments are shifted out of the chains and into tester memory, they can be combined with the already stored excess data. This step of combining data is well known, and can be done on the tester, or in a later step by software outside the tester.

If there are at least as many shift register latches as there are chains, the distribution of latches among chains can always be done in such a way that all chains have the same number of segments, and that all segments, except perhaps the last ones, all have the same length.

Pursuant to an analysis of the present invention, a block of values in segment latches can be moved to one of the two next segments, and an arbitrary sequence of lateral (l) and down (d) connections can be used. In principle, an analysis of the present invention can use any combination of straight down and lateral down shifts, but that would result in a large number of possibilities. To simplify the analysis, a simple routine segment identification uses only patterns lll..ld..ddd with m laterals, and n-m downs (0<=m<=n-1) with n patterns, or with 2n patterns if patterns of the form ddd..dl..lll are used.

While several embodiments and variations of the present invention for a segmented scan chains with dynamic reconfigurations are described in detail herein, it should be apparent that the disclosure and teachings of the present invention will suggest many alternative designs to those skilled in the art.

The invention claimed is:

1. A method of segmenting and reconfiguring scan chains to diagnose defects in the scan chains comprising:
   partitioning a plurality of serially extending scan chains into a plurality of serially arranged segments, such that each serially extending scan chain comprises a plurality of serially extending segments;
   positioning a plurality of switches, having control inputs to control switching of the switches, between the plurality of segments of each scan chain;
   controlling the control inputs of the plurality of switches to connect,
   each segment of each scan chain except an initial segment to a preceding serial segment in the same scan chain, and each segment of each scan chain except a final segment to a next serial segment in the same scan chain, or
   each segment of each scan chain except an initial segment to a preceding serial-adjacent segment in an adjacent scan chain, and each segment of each scan chain except a final segment to a next serial-adjacent segment in an adjacent scan chain,
   wherein, depending upon the control inputs to the switches, an output of each scan segment is directed either to a next serial segment in the same scan chain or to a next serial-adjacent segment in an adjacent scan chain, and a preceding serial segment in an adjacent scan chain and the next serial segment in an adjacent scan chain are in different scan chains.

2. The method of claim 1, further including:
   directing scan in data patterns into the plurality of serially extending scan chains;
   identifying particular defective segments of the plurality of serially extending scan chains by controlling the switches to connect and shift the data pattern out of each segment of a scan chain serially to a next serial segment in the same scan chain, or to connect and shift the data pattern out of each segment of a scan chain to a next serial-adjacent segment in an adjacent scan chain, with a sequence of serial shifts and serial-adjacent shifts being selected to identify particular defective segments of the plurality of serially extending scan chains.

3. The method of claim 2, wherein the step of controlling asserts a control input of a first type that connects and shifts the data pattern out of each segment of a scan chain to a next serial segment in the same scan chain, or a control input of a second type that connects and shifts the data pattern out of each segment of a scan chain to a next serial-adjacent segment in an adjacent scan chain.

4. The method of claim 3, wherein the switches are multiplexors and a single control input controls all of the multiplexors.

5. The method of claim 4, wherein the single control input statically restructures the scan chains prior to directing scan in data patterns into the plurality of serially extending scan chains.

6. The method of claim 4, wherein the single control input dynamically restructures the scan chains while the data patterns are being clocked through the plurality of dynamically restructured scan chains.

7. The method of claim 6, wherein the single control input dynamically restructures the scan chains to route blocks of data having a uniform length through the dynamically restructured scan chains.

8. The method of claim 6, wherein the single control input dynamically restructures the scan chains to route blocks of data having a uniform length through the dynamically restructured scan chains, except for a non-uniform length initial segment or a non-uniform length final segment.

9. The method of claim 4, wherein the single control input statically restructures the scan chains prior to directing scan in data patterns into the plurality of serially extending scan chains, and also dynamically restructures the scan chains while the data patterns are being clocked through the plurality of dynamically restructured scan chains.

10. The method of claim 9, wherein the single control input dynamically restructures the scan chains to route blocks of data having a uniform length through the dynamically restructured scan chains.

11. The method of claim 9, wherein the single control input dynamically restructures the scan chains to route blocks of data having a uniform length through the dynamically restructured scan chains, except for a non-uniform length initial segment or a non-uniform length final segment.

12. The method of claim 3, wherein in a first test, an input scan in data pattern is introduced into the beginning of each serially extending scan chain, and the switches are controlled by the control input of a first type such that the data patterns are clocked serially through the scan chains, and if all scan chains are perfect with no fails, the scan out data pattern at the end of each scan chain is identical to the input scan in data pattern or to a logical inverse of the input scan in data pattern.

13. The method of claim 12, wherein after the first test, when at least one fail scan chain suffers a fail wherein the scan out data pattern at the end of the fail scan chain is not identical to the input scan in data pattern into the fail scan chain or to the logical inverse of the input scan in data pattern into the fail scan chain, then the control input is set to the second type such that the scan chains are reconfigured to connect each segment of a scan chain to a next serial-adjacent segment in an adjacent scan chain.

14. The method of claim 1, wherein the step of partitioning partitions all segments in all scan chains to be the same length.

15. The method of claim 1, wherein the step of partitioning partitions all segments in all scan chains to be the same length except initial segments in all scan chains.

16. The method of claim 1, wherein the step of partitioning partitions all segments in all scan chains to be the same length except final segments in all scan chains.

17. The method of claim 1, wherein the step of partitioning partitions the plurality of scan chains into a plurality of segments wherein the number n of segments in each scan chain is equal to the number n of scan chains.

* * * * *